United States Patent [19]
Hirata et al.

[11] Patent Number: 6,071,821
[45] Date of Patent: Jun. 6, 2000

[54] DRY ETCHING METHOD OF THIN FILM

[75] Inventors: Noriyuki Hirata; Mitsuru Shibata, both of Fukaya, Japan

[73] Assignee: Kabushiki Kaisha Toshiba, Kawasaki, Japan

[21] Appl. No.: 09/128,668

[22] Filed: Aug. 4, 1998

[30] Foreign Application Priority Data

Aug. 4, 1997 [JP] Japan .................................. 9-209096

[51] Int. Cl.⁷ .............................................. H01L 21/3065
[52] U.S. Cl. ............................................................ 438/706
[58] Field of Search .................................. 438/706, 714, 438/734, 735, 9

[56] References Cited

U.S. PATENT DOCUMENTS 4,886,569 12/1989 Ojha et al. ............................... 438/664
5,702,562 12/1997 Wakahara .................................. 216/60
5,783,496 7/1998 Flanner et al. ........................... 438/743

FOREIGN PATENT DOCUMENTS 2597611 1/1997 Japan .

Primary Examiner—Benjamin L. Utech
Assistant Examiner—Lynette T. Umez-Eronini
Attorney, Agent, or Firm—Pillsbury Madison & Sutro, LLP

[57] ABSTRACT

A dry etching method of a thin film comprising the steps of, forming a resist pattern on a thin film, performing a first etching wherein the thin film is selectively dry-etched under a first etching condition using the resist pattern as a mask, and performing a second etching wherein the thin film is selectively dry-etched under a second etching condition using the resist pattern as a mask, the second etching condition differing from the first etching condition, wherein changing from the first etching step to the second etching step is performed before the selective etching of the thin film is accomplished.

19 Claims, 8 Drawing Sheets

DRY ETCHING METHOD OF THIN FILM

BACKGROUND OF THE INVENTION

This invention relates to a dry etching method of a thin film, and in particular to a dry etching method suitable for patterning a lower wiring layer of a multi-layered wiring intersecting with an interlayer insulating film intervened therebetween. For example, this invention relates to a dry etching method of a metallic thin film for the formation of a gate wiring of thin film transistor to be employed for a liquid crystal display device.

There has been conventionally known, as a method of forming a metallic wiring on a substrate, a method of dry-etching a metallic thin film by making use of a chemical dry etching apparatus wherein a resist pattern is employed as a mask. Followings are explanations on the method of forming a wiring of molybdenum tungsten alloy (MoW) thin film on a transparent insulating substrate such as a glass substrate by making use of a conventional chemical dry etching apparatus, the explanations being made referring to the flow chart shown in FIG. 1.

First of all, a resist is coated on a thin film of the alloy on the surface of a substrate. Then, the resist is selectively exposed to light by making use of an exposure apparatus, followed by a step of developing a resist pattern using a developing apparatus, thus forming a resist mask to be employed in a subsequent etching step. Subsequently, the substrate is transferred to an etching chamber, and the etching chamber is evacuated to a high vacuum degree (for example, 3 Pa or less) (pre-etching evacuation). Thereafter, the pressure inside the etching chamber is adjusted, and then an etching gas which is required for etching the metallic thin film (such as carbon tetrafluoride and oxygen) is activated. The activated etching gas is introduced to the surface of the substrate to etch the metallic thin film formed on the substrate.

After a predetermined period of etching, the supply of the etching gas is stopped. Subsequently, the interior of the etching chamber is evacuated to a high vacuum degree (for example, 3 Pa or less), and the substrate bearing a wiring of the metallic thin film thereon is taken out of the etching chamber.

A lower wring of a multi-layered wiring intersecting with an insulating film deposited by a CVD method on the substrate easily short-circuits with an upper wiring, and the upper wiring easily opens at the edge of the lower wiring. For these reasons, the lower wiring is required to have a tapered edge surface. In particular, when the lower wiring has a thickness of at least 300 nm, it is necessary to control the shape of the lower wiring.

For example, it is required to form a wiring having a side wall with tapering angle of 30±5° with the surface of the substrate by selectively etching a molybdenum tungsten alloy (MoW) thin film having a thickness of 400 nm.

This tapered shape is obtained by performing the plasma discharging for 720 seconds using a mixed gas consisting of carbon tetrafluoride/oxygen gas (½ in mixing ratio for instance so as to realize ⅓ in ratio of etching rate between the resist and the molybdenum tungsten alloy (MoW) thin film) under the conditions of: 1,000 sccm in total etching gas flow rate, 30 Pa in pressure adjusted of the etching chamber and 800 W in microwave power.

The etching, however, takes a long period of time for the reasons explained as follows.

(1) When a metallic thin film is etched by means of dry etching method to such an extent that an underlying layer is exposed, the active radicals contributing to the etching are concentrated at a portion of the metallic thin film that still remains unetched thereby to accelerate the etching reaction of the remaining portion of the metallic thin film. Therefore, as soon as the surface of an underlying layer is exposed, the etching rate of the metallic thin film is rapidly accelerated. However, as far as the etching rate of a resist is concerned, since the etching area of the resist is not prominently changed, there is not any prominent change in etching rate thereof. As a result, the ratio in etching rate between the resist and the metallic thin film before the accomplishment of just etching of the metallic thin film is caused to change once the just etching is accomplished.

On the other hand, it is known that, in order to work the metallic thin film in such a manner that the side walls of wiring to be formed are caused to incline at a suitable tapering angle, it is required to select a suitable condition where the ratio in etching rate between the resist and the metallic thin film can be maintained at a suitable degree during the etching process.

In order to meet the aforementioned both conditions, it is required to find out a condition where the etching rate of the metallic thin film cannot be prominently changed even if the surface of underlying layer is exposed, i.e. to find out a condition where the etching rate of the metallic thin film becomes relatively slow. Further, it is required, through preliminary working of metallic thin film so as to confirm the configuration of wiring to be obtained by variously changing the etching conditions, to select etching conditions (the mixing ratio of gases, the gas flow rate, the pressure, the electric power to be applied and the etching period) which enable to obtain such a suitable ratio in etching rate between the resist and the metallic thin film that renders the side wall of wiring to become a suitable tapering angle at the finish of the etching period.

(2) As mentioned above, since the time when an underlying layer begins to be exposed (hereinafter referred to as exposure-initiating time) in the process of etching is influenced by the distribution of film thickness of a metallic thin film and also by the non-uniformity in etching rate in the plane of substrate, the exposure-initiating time becomes non-uniform depending on a specific region in the plane of substrate. Due to this non-uniformity of the exposure-initiating time, a residue of redundant metallic thin film is caused to remain on the surface of substrate unless the etching is performed taking a sufficient time. On the other hand, if the etching is performed excessively, not only the tapering angle of the wiring but also the dimensional precision of pattern becomes non-uniform, thus raising another problem.

Therefore, in the conventional method, a fairly low etching rate of a metallic thin film, i.e. about 40 nm/min or less was selected, and a relatively sufficient overetchis was performed.

Thus, when a wiring is formed from a molybdenum tungsten alloy thin film and by means of the conventional etching method, it takes 10 seconds for the pre-etching evacuation, 20 seconds for the pre-etching pressure adjustment, 720 seconds for the etching and 10 seconds for the post-etching evacuation. Namely, a long period of 760 seconds in total is required for the etching treatment of a single sheet of substrate.

Meanwhile, if there is a corner portion in an electrode of a thin film transistor, an interlayer short circuit tends to be generated in a wiring, etc. being formed via an interlayer insulating film on the electrode. As a method for preventing such a short circuit, the following method has been proposed in Japanese Patent Unexamined Publication H/1-158776.

First of all, a gate electrode material is deposited on a substrate to form a gate electrode material film, which is then patterned with a resist pattern being employed as a mask thereby to carry out a first etching, thus obtaining a pattern having tapered side walls. Then, a second etching is performed under a condition where the etching rate of the resist is higher than the etching rate of the gate electrode material, thereby turning the tapered side walls into arcuate side walls.

However, since the loading effect becomes prominent if a substrate of large diameter, which is necessary to produce a liquid crystal display device, is employed in particular, it becomes very difficult to detect the changing time from the first etching to the second etching, i.e. to detect the end point of the first etching. As a result, the second etching is usually performed after the underlying layer below the gate electrode material film has been completely exposed, thus raising a problem that the width of the wiring to be formed becomes non-uniform.

BRIEF SUMMARY OF THE INVENTION

Therefore, an object of this invention is to provide a dry etching method of a thin film, which enables to obtain a pattern of the thin film having a desired tapering angle and being excellent in dimensional precision.

Another object of this invention is to provide a dry etching method of a thin film, which enables to obtain an excellent patterning precision over a large area, a high etching uniformity and a high etching reproducibility.

Further object of this invention is to provide a dry etching method of a thin film, which enables to ensure an excellent patterning precision for a short time.

Namely, according to the present invention, there is provided a dry etching method of a thin film comprising the steps of; forming a resist pattern on a thin film; performing a first etching wherein the thin film is selectively dry-etched under a first etching condition using the resist pattern as a mask; and performing a second etching wherein the thin film is selectively dry-etched under a second etching condition using the resist pattern as a mask, the second etching condition differing from the first etching condition; wherein changing from the first etching step to the second etching step is performed before the selective etching of the thin film is accomplished.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
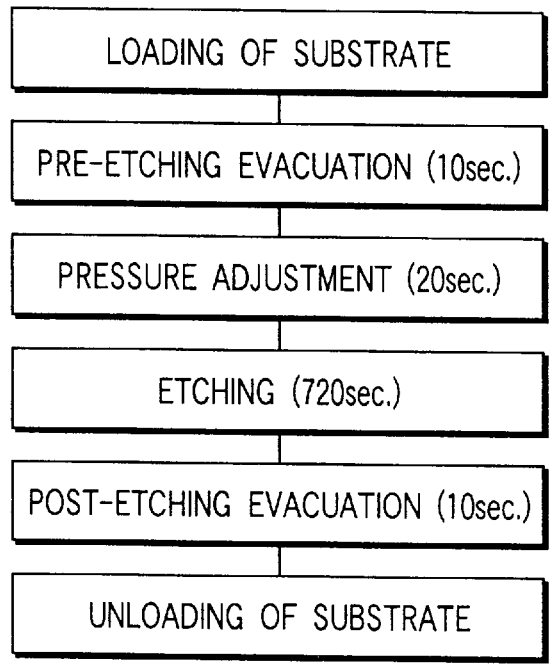
FIG. 1 is a flow chart illustrating a conventional dry etching method.

Followings are detailed explanation of a dry etching method of this invention.

In the method dry etching a thin film according to this invention, a substrate to be treated is placed in a vacuum vessel provided with a gas inlet port and one or more kinds of etching gas is introduced into the vacuum vessel, while applying a high frequency or microwave power to the etching gas thereby causing a plasma to generate, thus activating the etching gas. As a result, an excited radical or ion which is capable of vaporizing the thin film through a reaction thereof with the thin film is introduced over the substrate thereby to dry-etch the thin film.

The dry etching method according to this invention is featured in that the etching condition is sequentially changed at least once in the process of the reaction between the thin film and the etching gas. Namely, the dry etching method according to this invention comprises a first etching step to be performed under a first etching condition and a second etching step to be performed under a second etching condition. The etching condition in this case includes one kind or a combination of two or more kinds of conditions selected from the total gas flow rate, the mixing ratio of gases, the pressure, the electric power to be applied, and the etching period.

The changing from the first etching step to the second etching step is performed before the selective etching of the thin film is accomplished. For example, the moment where at least 80%, for example, about 90% of etching area is completely etched to expose an underlying layer disposed below the thin film is defined as an end point of the first etching step, and the aforementioned changing is performed by detecting this end point.

The detection of this end point of the first etching step can be performed automatically by making use of an etching end point-detection mechanism which measures a change in pressure or a change in luminous intensity for example, around the thin film inside the vacuum vessel.

As for the underlying layer for the thin film, it is preferable to select a material whose etching rate under the first etching condition is 1 to 8% based on the etching rate of the thin film.

With regard to the dry etching apparatus applicable to the method of this invention, a capacitance coupling type, induction coupling type, or microwave exciting type etching apparatus which is known in the art can be employed.

The etching of a substrate to be treated can be performed as follows. First of all, the substrate provided on the surface thereof with a thin film is arranged in a vacuum vessel. Then, an activated etching gas for use under the first etching condition is introduced over the substrate to initiate the first etching of the substrate.

The first etching is continued to proceed until at least 80%, for example, about 90% of the underlying layer disposed below the thin film is exposed. Then, the etching condition is changed to the second etching condition, and an activated etching gas for use under the second etching condition is introduced over the substrate to perform the second etching of the substrate.

In this invention, "% of the underlying layer is exposed" means that an exposed ratio of the underlying layer on the way of the etching where an area of the exposed portion of the underlying layer, which does not correspond to an etching mask, in the final pattern configuration (set value) is 100%. In this case, the final pattern configuration approximately corresponds to a resist mask configuration.

As for the etching gas, a mixed gas consisting of carbon tetrafluoride and oxygen can be employed when the thin film to be treated is formed of a molybdenum tungsten alloy. A chlorine series gas such as $Cl_2$ and $BCl_2$ can be employed when the thin film is formed of aluminum (Al) or aluminum alloy. The changing of the first etching condition to the second etching condition can be performed by changing the flow rate or the mixing ratio of the mixed gas.

The first etching condition should preferably be selected such that the ratio in etching rate between the resist constituting a mask and the thin film becomes high and the etching rate of the thin film is relatively large, i.e. to select a condition where the ratio in etching rate of oxygen/carbon tetrafluoride is larger than 1. While, the second etching condition should preferably be selected such that the ratio in etching rate between the resist and the thin film becomes low and the etching rate of the thin film is relatively small, i.e. to select a condition where the ratio in etching rate of oxygen/carbon tetrafluoride is sufficiently smaller than 1. If the first and second etching conditions are formulated in this manner, it is possible to obtain a pattern of thin film exhibiting an excellently tapered side walls and a high working precision within a short period of time. This invention is suitable for obtaining a uniform taper angle of less than 45° or less than 35°.

The gas pressure inside the vacuum vessel in the method of this invention should preferably be set to 10 to 100 Pa depending on the etching conditions. In the method of this invention, the interior of the vacuum vessel is not required to be evacuated to as low as several pascals or less throughout the entire etching process, and hence a vacuum pump having a high evacuation capacity such as a wide range turbo-molecular pump is no more required to be employed.

Next, a method for detecting the end point of etching that can be employed in the dry etching method of this invention will be explained.

There are generally known the following two methods for detecting the end point of etching in the dry etching method.

(1) A method of detecting a change in pressure inside an etching chamber.
(2) A method of detecting a light emission of specific wavelength selected for each film to be etched.

In any of these methods, the value detected is converted into a variation in voltage and the resultant voltage variation is differentiated to obtain a profile. Then, a threshold value 1 and a threshold value 2 are set for this profile obtained through the differentiation so as to detect an end point by determining a point where the differentiated value passes over the threshold value 1 and reaches to the threshold value 2 (FIG. 2).

This invention provides a method of detecting the end point of etching more precisely.

Figure 3A:
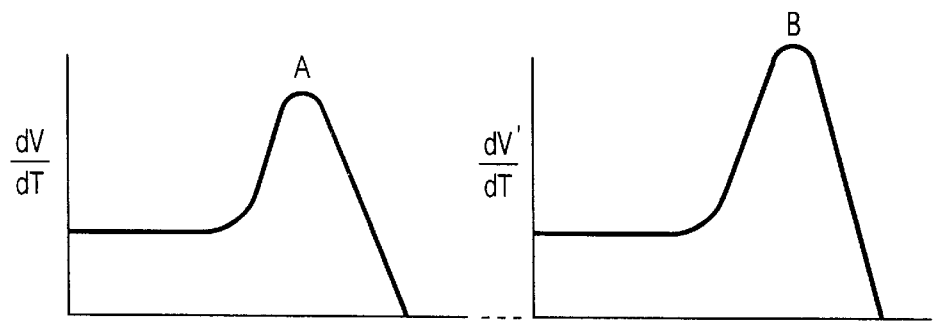
FIGS. 3A to 3C are graphs for explaining another method of detecting an end point of etching.
Figure 3B:
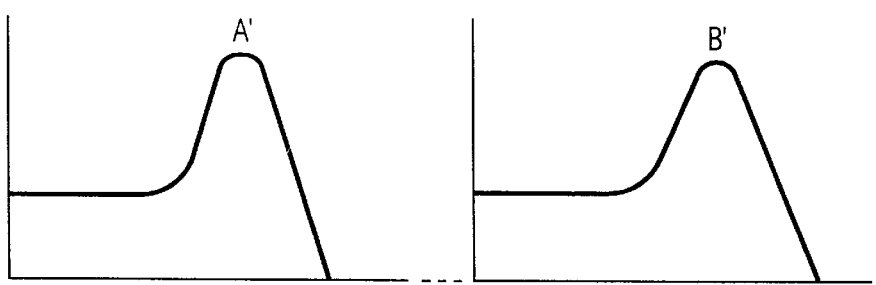
Figure 3C:
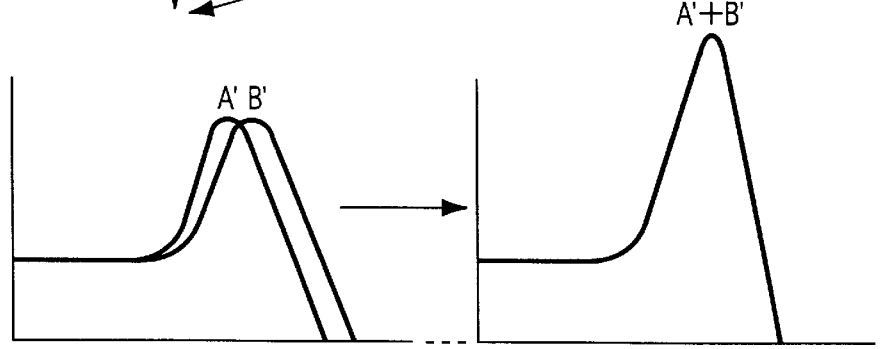

First of all, as shown in FIG. 3A, the values detected of pressure variation and of light emission intensity are converted into variations in voltage and the resultant voltage variations are differentiated to obtain a differential curve (dV/dT, dV'/dT), respectively. Then, as shown in FIG. 3B, the peak intensity of each differential curve is processed to correct the scale factors thereof, and thereafter these corrected values are added to each other to prepare a profile as shown in FIG. 3C.

Figure 2:
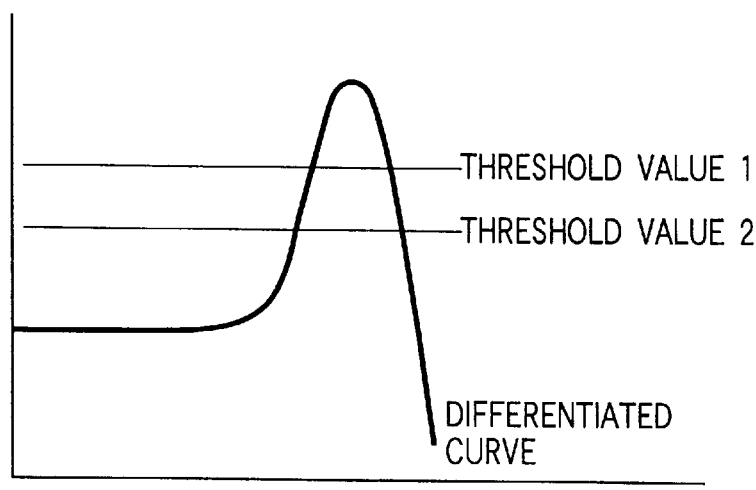
FIG. 2 is a graph for explaining a method of detecting an end point of etching.

Subsequently, as shown in FIG. 2, a threshold value 1 and a threshold value 2 are set for this profile so as to detect an end point by determining a point where the profile curve exceeds over the threshold value 1 and reaches to the threshold value 2(FIG. 2). Namely, the added value of values detected of two or more kinds of factor is employed for detecting an end point of etching.

Though the output after peak of the profile curve is detected in the above method, the output before peak of the profile curve or the output of peak.

As explained above, according to the dry etching method of this invention, the first etching step is aimed at rapidly removing a region of thin film which is redundant for the formation of a pattern, while the second etching step is aimed at removing a redundant residual portion of thin film, at aligning the pattern with a predetermined patterning dimension and at aligning the side wall of the pattern with a predetermined tapering angle. Since the purpose of the first etching step differs from the purpose of the first etching step as mentioned above, it has become possible to perform an excellent etching within a short period of time.

Since the purposes of etching are shared by these etching steps, the alignment of etching conditions becomes easy, and an excellent reproducibility can be assured with regard to a film thickness and an etching condition.

Furthermore, the changing of etching conditions is performed by detecting the end point of etching by means of an etching end point-detection mechanism at the moment when the underlying layer disposed below the thin film begins to be exposed and the etching rate is caused to prominently alter. Since the changing of etching conditions is performed in this manner, the problems that may be raised when the etching is performed under the same condition throughout the entire etching process, i.e. the influences by a change in etching condition due to the exposure of the underlying layer are no more required to be taken into consideration. Further, even if the thickness of the thin film or the distribution of thickness thereof is altered, it is possible to form an excellent dimensional precision in high reproducibility, since the etching time of the first etching step is controlled by making use of an etching end point-detection mechanism while the etching time of the second etching step is set to 20 to 40% of that of the first etching step.

In particular, if a wiring pattern of thin film consisting of a high melting point metal is to be formed, it is desirable to employ, as an underlying layer, a silicon oxide thin film whose etching rate is in the range of 1 to 10% in relative to the etching rate of the high melting point metal under the condition of the first etching step. Because, since a reaction takes place between the activated free radical and the underlying layer at the region very close to the underlying layer during the etching under the second etching condition, the etching of the metallic thin film at this region becomes very slow, so that the etching rate is caused to vary in perpendicular direction from the surface of underlying layer to the top of the metallic thin film, i.e. the etching rate of the metallic thin film is very slow in the vicinity of the underlying layer but becomes faster as it is located further away from the underlying layer. As a result of this phenomenon, the side wall of the metallic thin film is caused to taper thereby making it possible within a short period of etching time to obtain a wiring excellent in working precision and in tapering angle.

The method of this invention is particularly effective in working a metallic thin film consisting of a high melting point metal such as a molybdenum tungsten (MoW) alloy thin film which is formed on a glass substrate or a silicon oxide compound layer so as to selectively etch the metallic thin film with a resist pattern being employed as an etching mask thereby to obtain a wiring having a tapered pattern where the worked (or etched) side wall of the wiring is inclined at an angle of 30±50°. When the wiring having such a pattern is used as a lower wiring of a multi-layered wiring intersecting with each other with an insulating film with intervened therebetween, short-circuiting between wiring layers and disconnection of an upper wiring are fully suppressed even if the film thickness of the lower wiring is 300 nm or more, or 400 nm or more. Therefore, the method of this invention can be advantageously utilized in the manufacture of a channel-etching type or channel-insulating type TFT (a reverse-stagger or stagger TFT) provided with a gate wiring having the aforementioned tapered configuration.

Further, the method of this invention is also applicable to the etching accompanying a prominent loading effect, such as the etching of a substrate having an area of 1,200 $cm^2$ or more. By the way, it has been confirmed that when a resist-covering area in the display pixel portion of a liquid crystal display device is less than 30%, in particular less than 20% based on the entire area of the display pixel portion, the loading effect becomes prominent. The reason for limiting to "the display pixel portion" in calculating the area is that the marginal region quite differs in covering ratio of resist from that in the display pixel portion, so that if this resist-covering area is calculated to obtain an average value including the marginal region, it becomes too large to explain the behavior of the loading effect.

This invention will be further explained with reference to the following examples.

Figure 4:
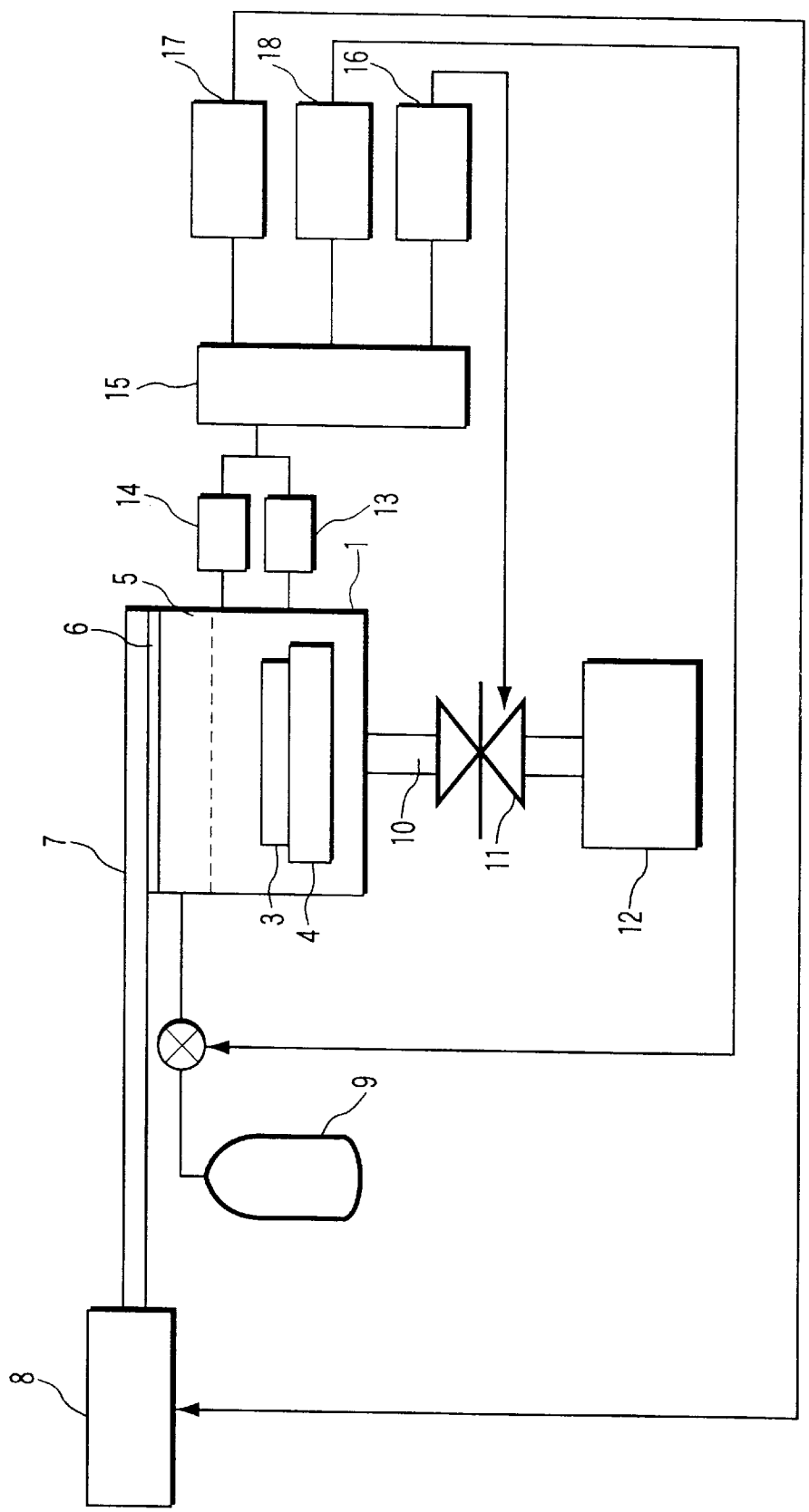
FIG. 4 is a diagram schematically illustrating a chemical dry etching apparatus to be employed in a dry etching method according to this invention.

FIG. 4 shows a schematical view of a chemical dry etching apparatus to be employed in a dry etching method according to this invention.

Referring to FIG. 4, a suceptor 4 for mounting thereon a substrate 3 to be treated are disposed in an etching chamber 1 which is capable to keep a low pressure, and a punching metal plate 2 is arranged to face the suceptor 4. A dielectric plate 6 is disposed over the punching metal plate 2 across a plasma exciting space 5. The dielectric plate 6 is coupled with a waveguide 7 connected with a microwave power source 8. An etching gas feeding portion 9 is connected with the plasma exciting space 5.

After the substrate 3 to be subjected to a chemical dry etching is introduced into the etching chamber 1 and mounted on the suceptor 4, an etching gas from the etching gas feeding portion 9 is introduced into the plasma exciting space 5. Under this condition, a microwave power is applied through the waveguide 7 to the plasma exciting space 5 from a microwave power source 8, thereby to generate a plasma in the plasma exciting portion 5. The active radical species thus generated in the etching gas and capable of taking part in the etching is led to the substrate 3 through the punching metal plate 2 and then allowed to react with the surface of the substrate 3 thereby to perform an etching.

The etching chamber 1 is also provided with an exhaust pipe 10 which is communicated via an automatic control throttle valve 11 with a booster-attached dry pump 12.

The etching chamber 1 is further provided with a pressure gage 13 for measuring the pressure inside the etching chamber 1 and a photo sensor 14 for detecting a luminous intensity in the etching chamber. Furthermore, the apparatus comprises an arithmetic processing section 15 for processing in accordance with the output from the pressure gage 13 and the photo sensor 15, a throttle valve-controlling section 16 for controlling a throttle valve 10 in accordance with the processing result of the arithmetic processing section 15, a microwave power source controlling section 17 for controlling the microwave power source 8 in accordance with the processing result of the arithmetic processing section 15, and a gas controlling section 18 for controlling a gas feeding amount from the etching gas feeding portion 9 in accordance with the processing result of the arithmetic processing section 15.

The dry etching of the thin film by making use of the quartz tube type chemical dry etching apparatus constructed as mentioned above can be performed as follows.

First of all, a thin film to be treated is deposited on the surface of a glass substrate for instance by means of a sputtering apparatus, and then a resist is coated on the surface of the thin film. Subsequently, the resist is selectively exposed to light by making use of an exposure apparatus and then subjected to a developing treatment by making use of a developing apparatus, thus forming a resist mask to be employed in a subsequent etching step. Subsequently, the substrate 3 is placed on a suceptor 4 in the etching chamber 1.

Thereafter, a microwave power is applied to the waveguide 7 from the microwave power source 8 while introducing an etching gas into the etching chamber 1 under the first etching condition. At this moment, the total flow rate of the entire treatment gases, the mixing ratio of gases, the pressure of gases and the electric power to be supplied are respectively set in advance to such a range that enables the ratio in etching rate between the resist and the thin film (the resist/the thin film) to fall within the range of 1/0.75 to 1/1.25 and also enables the etching rate of the thin film to fall within the range of 10 to 300 nm/min.

This plasma discharge is controlled by making use of an etching end point-detection mechanism which is capable of detecting the moment when about 90% in area (based on the entire top surface of the substrate) of an underlying layer disposed below a metallic thin film is exposed, so that when an end point detection signal is emitted from this etching end point-detection mechanism, the etching is immediately suspended. By this first etching step, the thin film is etched into a pattern having a side wall which is inclined at an angle which is larger than the desired ultimate tapering angle by 5 to 10°.

After the suspension of the plasma discharging, the supply of gas under the first etching condition is also suspended, and then an etching gas is introduced into the etching chamber under the second etching condition. At the same time, a microwave power is applied again to the waveguide 7 from the microwave power source 8 thereby to perform the second etching step.

At this moment, the total flow rate of the entire treatment gases, the mixing ratio of gases, the pressure of gases and the electric power to be supplied (all designed to meet the second etching condition) are respectively set in advance to such a range that enables the ratio in etching rate between the resist and the thin film (the resist/the thin film) to fall within the range of 1/0.15 to 1/0.25 and also enables the etching rate of the thin film to be reduced to 30 to 45% of the etching rate in the first etching condition. In this case, if the pressure of etching gas is made higher than that of the first etching condition by 10 Pa or more, it is possible to realize the aforementioned condition by simply changing the mixing ratio of gases and altering the magnitude of power supply.

Further, if the duration of the plasma discharge in the second etching step is set to 20 to 40% of the duration of the plasma discharge in the first etching step, it is possible to work the thin film to have a desired tapering angle and to make it excellent in dimensional precision.

EXAMPLE 1

Figure 5:
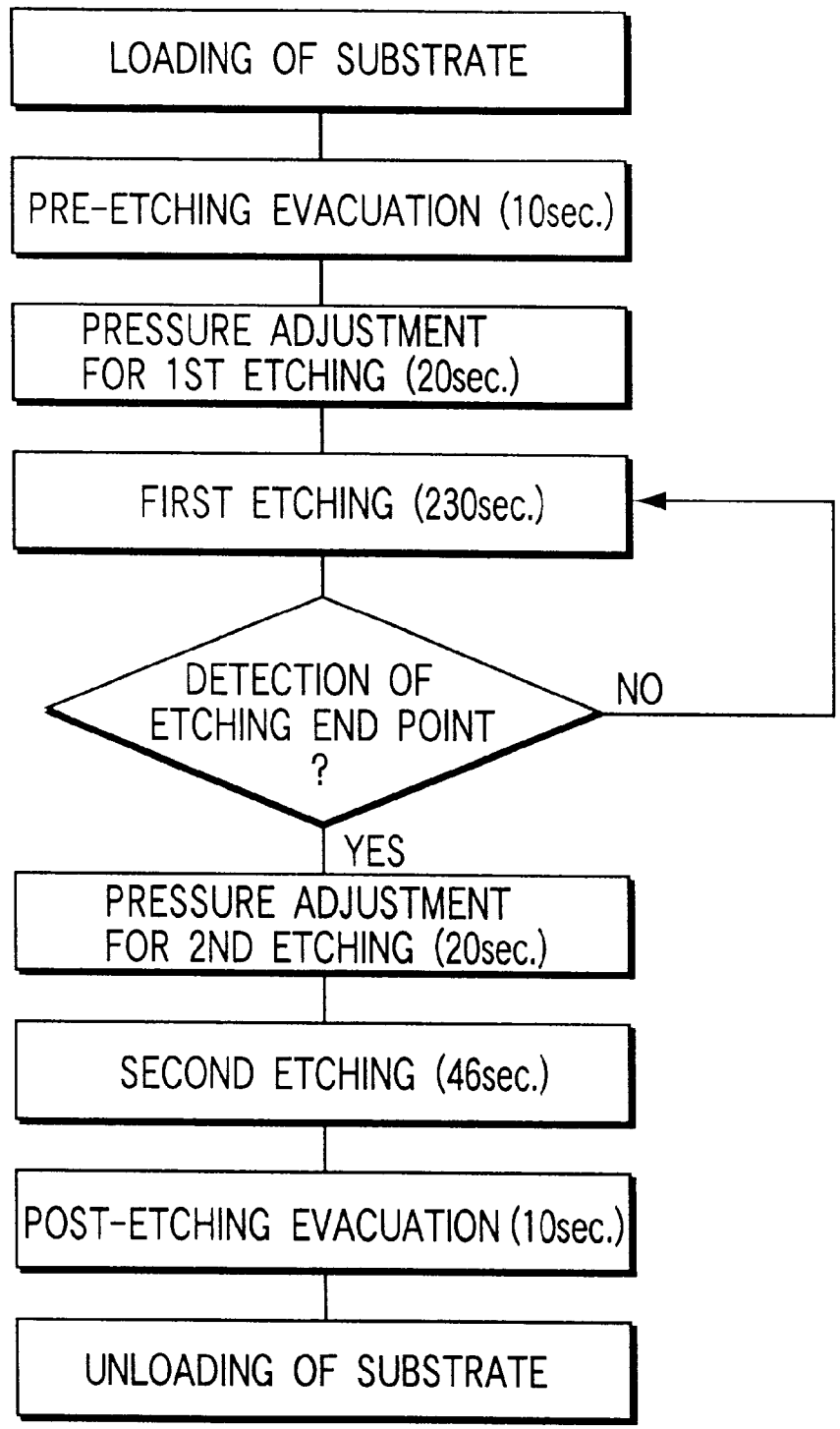
FIG. 5 is a flow chart illustrating a dry etching method according to a first example of this invention.

By making use of the chemical dry etching apparatus shown in FIG. 4 and by following the flow chart shown in FIG. 5, a wiring consisting of a molybdenum tungsten alloy thin film was formed on a silicon oxide film as shown in FIGS. 6A to 6E.

Figure 6A:
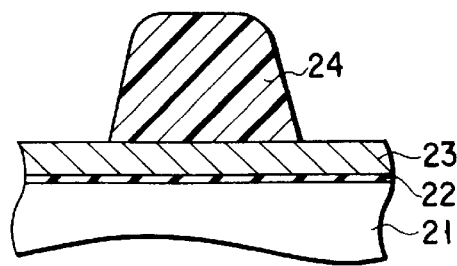
FIGS. 6A to 6E are cross-sectional views illustrating in stepwise the dry etching method according to the first example of this invention.

First of all, as shown in FIG. 6A, a molybdenum tungsten alloy (MoW) thin film 23 having a thickness of 400 nm was formed by means of sputtering on a silicon oxide film 22 which had been formed on a glass substrate 21 having a size of 550 mm×650 mm. Then, a resist was coated on the surface of the molybdenum tungsten alloy (MoW) thin film 23 by making use of a resist-coating apparatus thereby to form a resist layer, which was then selectively exposed to light by making use of an exposure apparatus and developed to obtain a resist mask 24 to be employed in a subsequent etching step. Thereafter, the substrate 21 was introduced into the etching chamber 1 and placed on the suceptor 4.

Then, the interior of the etching chamber 1 was evacuated until a high vacuum condition (for example, 3 Pa or less) is obtained (pre-etching evacuation). Thereafter, as etching gases required for the first etching, carbon tetrafluoride and oxygen were introduced into the etching chamber 1 at a flow rate of 445 sccm and 555 sccm respectively by making use of a flow-controlling mechanism of the etching gas supply portion 6. In this case, the pressure adjustment of the etching chamber 1 to stably maintain the interior thereof at a preset pressure of 30 Pa was performed by making use of the automatic control throttle valve 11, which was designed to adjust the pressure inside the etching chamber 1 to a preset pressure in response to a signal from the pressure gage 13 attached to the etching chamber 1.

In this case, a time period of 20 seconds was required for maintaining the aforementioned stabilized state of pressure.

Figure 6B:
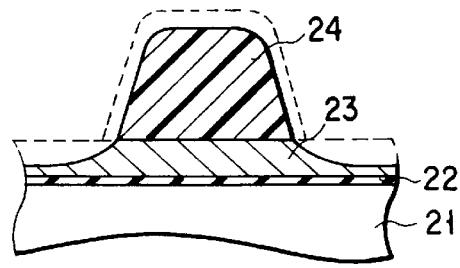

Then, the opening degree of the automatic control throttle valve 11 was locked to maintain this condition, and a microwave power (which was preset to 800 W) was applied from the microwave power source 8 thereby to generate an etching gas plasma in the plasma exciting space 5. The activated radical species useful for the etching is led to the substrate 3 through the punching metal plate 2. As a result, a reaction between the activated radical species and the surface of the substrate 3 was initiated, thus performing the etching of the molybdenum tungsten alloy (MoW) thin film 23 as shown in FIG. 6B. The reason for locking the opening degree of the automatic control throttle valve 10 was to perform the detection of the end point of the initiated etching by taking advantage of a change of pressure in the etching chamber 1.

In this invention, the end point of etching is detected by measuring a change in pressure inside the etching chamber 1. That is, the output from the pressure gage 13 is differentiation-processed to obtain a differentiated value curve. In this case, the threshold value 1 and the threshold value 2 are set to 0.1 and 0.05, respectively, in order to detect the end point of etching wherein a superfluous portion of the thin film has been already removed in 95% of the entire area thereof from the surface of the underlying layer as a result of the proceeding of etching to expose the underlying layer below the thin film. A point where the differentiated value exceeds over the threshold value 1 and reaches to the threshold value 2, that is, a point where the differentiated value exceeds the peak of the differentiated value curve and reaches to a prescribed value, is detected as the end point of etching.

Figure 6C:
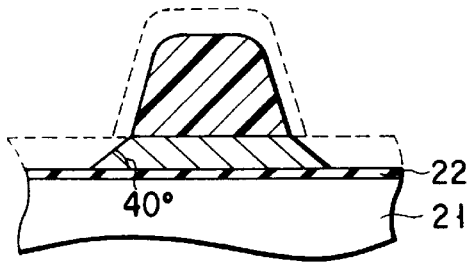

Upon receipt of this end point-detecting signal, the application of the microwave power was suspended in accordance with the indication from the microwave source controlling section 17, thereby to finish the first etching at the moment shown in FIG. 6C. This first etching was continued for 230 seconds when the thickness of the thin film 23 was 400 nm.

The aforementioned first etching condition (the total flow rate of etching gases, the mixing ratio of gases, the pressure of gases, the electric power to be applied and the period of etching) was set in advance through experiments to such that the ratio in etching rate between the resist 24 and the thin film 23 (the resist/the thin film) would become larger than 1, i.e. 1/0.8 and that the etching rate of the thin film 23 would become 100 nm/min.

As a result of this first etching step, the thin film was etched into a pattern having a side wall which was inclined at a tapering angle of about 40° as shown in FIG. 6C as against the desired ultimate tapering angle of 30°. At this point, the patter is not a final pattern.

In this example, the end point of the etching is detected by using the pressure gage 13. However, the end point can be detected by using the photo sensor, or a combination of the pressure gage and the photo sensor. Where the combination of the pressure gage and the photo sensor is used, the end point is detected based on the preset threshold value of the combined curves from the both differentiated values of the corrected outputs of the pressure gage and the photo sensor, for example, as shown in FIG. 3. The threshold values 1 and 2 are set to 0.1 and 0.05, respectively, as described above. This first etching was continued for 230 seconds when the thickness of the thin film was 400 nm.

In simultaneous with the finishing of the first etching, the flow rate of etching gases was changed according to the second etching condition. Namely, the same kinds of etching gas as employed in the first etching, i.e. carbon tetrafluoride and oxygen were introduced into the etching chamber 1 at a flow rate of 200 sccm and 800 sccm respectively by making use of a flow-controlling mechanism of the etching gas supply portion 6. In this case, the pressure adjustment of the etching chamber 1 to stably maintain the interior thereof at a preset pressure of 100 Pa was performed by making use of the automatic control throttle valve 10, which was designed to adjust the pressure inside the etching chamber 1 to a preset pressure in response to a signal from the pressure gage 13 attached to the etching chamber 1.

In this case, a time period of 20 seconds was required for maintaining the aforementioned stabilized state of pressure.

Figure 6D:
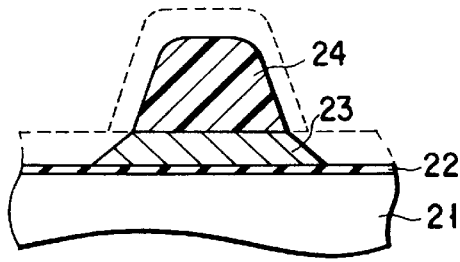

Then, a microwave power (which was preset to 500 W) was applied from the microwave power source 8 thereby to generate an etching gas plasma. As a result, a reaction between the activated radical species useful for the etching and the surface of the substrate 3 was initiated, thus continuing the etching of the thin film 23 as shown in FIG. 6D. In this case, the second etching was continued for 46 seconds, corresponding to 20% of 230 seconds of the first etching time.

Since the first etching time can be determined at the occasion of detecting the end point of the first etching, this second etching time can be automatically set by calculating the time corresponding to 20% of the first etching time.

The aforementioned second etching condition (the total flow rate of etching gases, the mixing ratio of gases, the pressure of gases, the electric power to be applied and the period of etching) was set in advance through experiments to such that the ratio in etching rate between the resist 24 and the thin film 23 (the resist/the thin film) became much smaller than 1, i.e. 0.15/1 and that the etching rate of the thin film 23 became as small as 33% of the etching rate in the first etching condition, which was less than a half of the first etching condition.

Figure 6E:
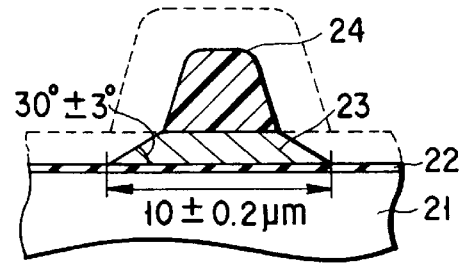

As a result of this second etching step, the thin film was etched into a pattern having a side wall which was inclined, throughout the entire surface of substrate, at a tapering angle of about 30°±3° as shown in FIG. 6E as against the desired ultimate tapering angle of 30°. Further, the line width of the pattern was 10±0.2 μm as against the predetermined line width of 10 μm, thus indicating a very excellent working of the thin film for forming a wiring.

Upon finishing the second etching, the etching chamber was evacuated until the ultimate vacuum thereof became 3 Pa or less (post-etching evacuation), after which the substrate 3 was taken out of the etching chamber 1. The time required for this post-etching evacuation was found to be 10 seconds when a booster-attached dry pump 11 having a sufficient evacuation capacity was employed.

As explained above, it was possible according to the etching method of this example to perform the etching taking only 336 seconds as against 760 seconds that has been required in the aforementioned conventional etching method, thus greatly shortening the etching time.

Since the silicon oxide thin film 22 (the etching rate of which under the first etching condition is 6% of the etching rate of the molybdenum tungsten alloy (MoW) thin film 23) was employed as an underlying layer in this example, the etching of the underlying thin film 22 was also proceeded during the second etching at the region where the underlying layer had been exposed by the first etching. Therefore, the etching rate of the alloy thin film 23 would be influenced by the underlying thin film 22.

Figure 7:
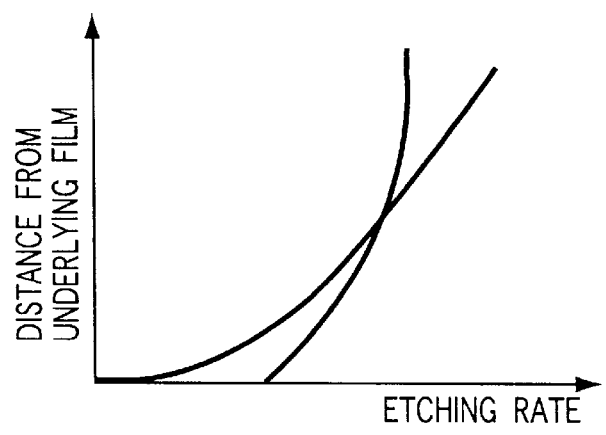
FIG. 7 is a graph illustrating the influence of an underlying layer on the change in etching rate of a thin film to be treated.

The changes in etching rate of the thin film due to the aforementioned influence by the underlying thin film are shown in FIG. 7 wherein the curve "a" represents the change wherein an SiO$_2$ was employed as an underlying layer, while the curve "b" represents the change wherein a glass was employed as an underlying layer.

As shown in FIG. 7, when the etching is proceeded near to the underlying thin film, the etching rate becomes slow. This can be attributed to the following phenomenon. Namely, when the etching is proceeded to such an extent as to partially expose the underlying layer 22, the etching of the underlying layer 22 is initiated. As a result, the activated radical useful for the etching reaction is consumed for the etching of the underlying layer 22, thus inviting a retardation of etching rate at a region of alloy thin film 23 which is close to the underlying layer 22 at the occasion of the second etching.

By taking advantage of this phenomenon, the second etching can be performed in such a manner that the etching rate is caused to vary in the perpendicular direction (or thickness-wise) of the alloy thin film 23 at the occasion of the second etching, thus making it possible to change the tapering angle of side wall of the pattern, which has been inclined at an angle of 40° as a result of the first etching, to an angle of 30°±3°. Furthermore, since the thinning of pattern width during this etching can be minimized, it is possible to form a thin film wiring having a line width of 10±0.2 μm as against the predetermined line width of 10 μm throughout the entire surface of the substrate 3, thus indicating an excellent conversion precision of pattern.

In this example, two kinds of etching condition was employed for changing to each other. However, it is also possible to employ three or more kinds of etching condition for changing to each other.

Further, in this example, the mixing ratio of gases in addition to the pressure of gases, the electric power and the etching time were changed in the changing of the etching condition without changing the total gas flow rate. However, the changing of the etching condition can be performed by changing at least one or a combination of the factors selected from the total gas flow rate, the mixing ratio of gases, the pressure of gases, the electric power and the etching time.

Although the detection of the etching end point in this example was performed by measuring a change in pressure inside the etching chamber, it is also possible to perform the detection of the etching end point by measuring the luminous intensity of the etching chamber, or by measuring the change in pressure and the luminous intensity.

When extremely high precision is required, it is desirable to detect the etching end point by measuring both the change in pressure and the luminous intensity. In order to simplify the process and the apparatus, either one of the change in pressure and the luminous intensity is desirably measured.

The method of etching in this example is not limited to the aforementioned chemical dry etching, but may be another kind of method such as a plasma etching method.

According to this example, the moment where a superfluous portion of the thin film has been removed in 95% of the entire area thereof was defined as the end point of the first etching, it is possible to change the setting of end point of the first etching as long as the ratio of removal of a superfluous portion of the thin film is within the range of 80 to 100% of the entire area thereof.

In short, this example is featured in that the etching away of any superfluous portion of the thin film is carried out at a high speed in the first etching step, and that the consumption of activated radical by the underlying layer below the thin film is taken advantage of thereby to realize a gradient of etching rate in perpendicular direction of the thin film. Due to the employment of these first and second etching steps, the dimensional precision, the etching residue of thin film and the tapering angle of pattern can be suitably controlled.

EXAMPLE 2

Figure 8:
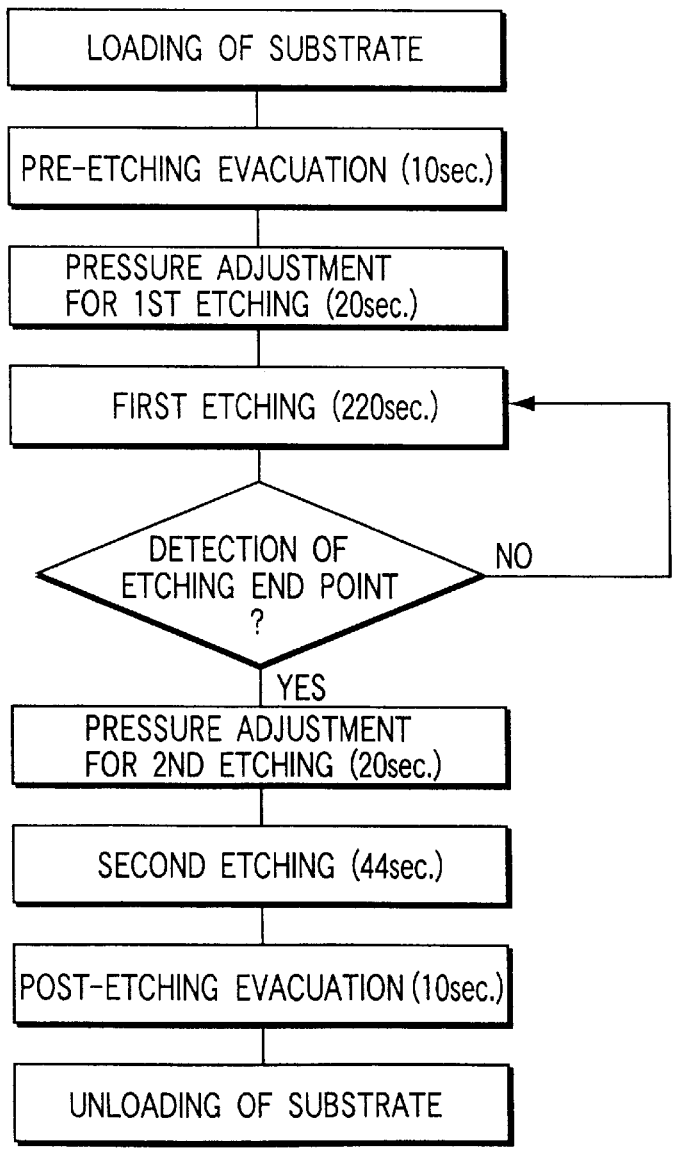
FIG. 8 is a flow chart illustrating a dry etching method according to a second example of this invention.

By making use of the chemical dry etching apparatus shown in FIG. 4 and by following the flow chart shown in FIG. 8, a wiring consisting of a molybdenum tungsten alloy (MoW) thin film was formed on a glass substrate as shown in FIGS. 9A to 9E.

Figure 9A:
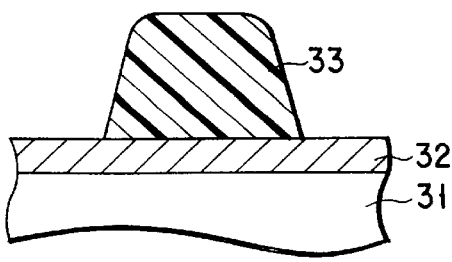
FIGS. 9A to 9E are cross-sectional views illustrating in stepwise the dry etching method according to the second example of this invention.

First of all, as shown in FIG. 9A, a molybdenum tungsten alloy (MoW) thin film 32 was formed by means of sputtering on a glass substrate 31. Then, a resist was coated on the surface of the molybdenum tungsten alloy thin film 32 by making use of a resist-coating apparatus thereby to form a resist layer, which was then selectively exposed to light by making use of an exposure apparatus and developed to obtain a resist mask 33 to be employed in a subsequent etching step. Thereafter, the resultant substrate was introduced into the etching chamber 1 and placed on the suceptor 4.

Then, the interior of the etching chamber 1 was evacuated until a high vacuum condition (for example, 3 Pa or less) is obtained (pre-etching evacuation). Thereafter, as etching gases required for the first etching, carbon tetrafluoride and oxygen were introduced into the etching chamber 1 at a flow rate of 445 sccm and 555 sccm respectively by making use of a flow-controlling mechanism of the etching gas supply portion 6. In this case, the pressure adjustment of the etching chamber 1 to stably maintain the interior thereof at a preset pressure of 30 Pa was performed by making use of the automatic control throttle valve 10, which was designed to adjust the pressure inside the etching chamber 1 to a preset pressure in response to a signal from the pressure gage 13 attached to the etching chamber 1.

In this case, a time period of 20 seconds was required for maintaining the aforementioned stabilized state of pressure.

Figure 9B:
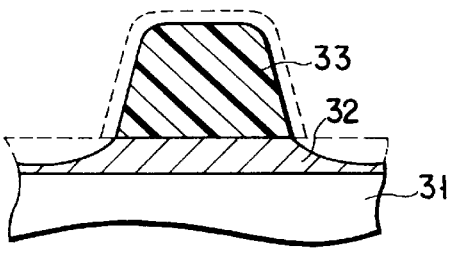

Then, the opening degree of the automatic control throttle valve 11 was locked to maintain this condition, and a microwave power (which was preset to 800 W) was applied from the microwave power source 8 thereby to generate an etching gas plasma in the plasma exciting space 5. The activated radical species useful for the etching is led to the substrate 31 through the punching metal plate 2. As a result, a reaction between the activated radical and the surface of the substrate 3 was initiated, thus performing the etching of the molybdenum tungsten alloy (MoW) thin film 32 as shown in FIG. 9B. The reason for locking the opening degree of the automatic control throttle valve 11 was to perform the detection of the end point of the initiated etching by taking advantage of a change of pressure in the etching chamber 1.

In this invention, the end point of etching is detected by measuring a change in pressure inside the etching chamber 1. That is, the output from the pressure gage 13 is differentiation-processed in the arithmetic processing section 15 to obtain a differentiated value curve as shown in FIG. 2. In this case, the threshold value 1 and the threshold value 2 are set to 0.1 and 0.07, respectively, in order to detect the end point of etching wherein a superfluous portion of the thin film 32 has been already removed in 90% of then entire area thereof from the surface of the substrate 31 as a result of the proceeding of etching to expose the substrate 31 below the thin film 32. A point where the differentiated value exceeds over the threshold value 1 and reaches to the threshold value 2 is detected as the end point of etching.

Figure 9C:
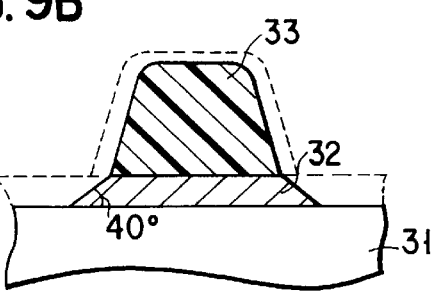

Upon receipt of this end point-detecting signal from the microwave power controlling section 17, the application of the microwave power was suspended thereby to finish the first etching at the moment shown in FIG. 9C. This first etching was continued for 220 seconds when the thickness of the thin film 32 was 400 nm.

The aforementioned first etching condition (the total flow rate of etching gases, the mixing ratio of gases, the pressure of gases, the electric power to be applied and the period of etching) was set in advance through experiments to such that the ratio in etching rate between the resist 33 and the thin film 32 (the resist/the thin film) would become 1/0.8 and that the etching rate of the thin film 32 would become 100 nm/min.

As a result of this first etching step, the thin film was etched into a pattern having a side wall which was inclined at a tapering angle of about 40° as shown in FIG. 9C as against the desired ultimate tapering angle of 30°, and at the same time, the cross-sectional shape of each line thus etched was expanded toward the bottom thereof, the width of the bottom portion being larger than the aimed width of 10 μm by about 1 μm.

In simultaneous with the finishing of the first etching, the flow rate of etching gases was changed according to the second etching condition. Namely, the same kinds of etching gas as employed in the first etching, i.e. carbon tetrafluoride and oxygen were introduced into the etching chamber 1 at a flow rate of 200 sccm and 800 sccm respectively by making use of a flow-controlling mechanism of the etching gas supply portion 6. In this case, the pressure adjustment of the etching chamber 1 to stably maintain the interior thereof at a preset pressure of 100 Pa was performed by making use of the automatic control throttle valve 11, which was designed to adjust the pressure inside the etching chamber 1 to a preset pressure in response to a signal from the pressure gage 13 attached to the etching chamber 1.

In this case, a time period of 20 seconds was required for maintaining the aforementioned stabilized state of pressure.

Figure 9D:
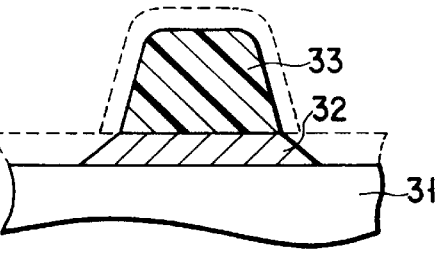

Then, a microwave power (which was preset to 500 W) was applied to from the microwave power source 8 thereby to generate an etching gas plasma. As a result, a reaction between the activated radical useful for the etching and the surface of the substrate 3 was initiated, thus continuing the etching of the molybdenum tungsten alloy thin film 32 as shown in FIG. 9D. In this case, the second etching was continued for 44 seconds, corresponding to 20% of 220 seconds of the first etching time.

Since the first etching time can be determined at the occasion of detecting the end point of the first etching, this second etching time can be automatically set by calculating the time corresponding to 20% of the first etching time.

The aforementioned second etching condition (the total flow rate of etching gases, the mixing ratio of gases, the pressure of gases, the electric power to be applied and the period of etching) was set in advance through experiments to such that the ratio in etching rate between the resist 33 and the thin film 32 (the resist/the thin film) would become 1/0.15 and that the etching rate of the thin film 32 would become 33% of the etching rate in the first etching condition.

Figure 9E:
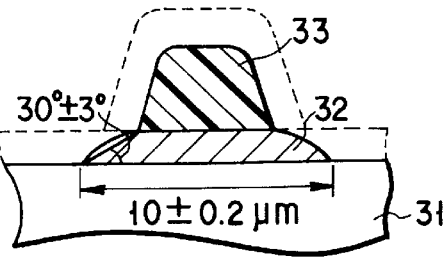

As a result of this second etching step, the thin film was etched into a pattern having a side wall which was inclined, throughout the entire surface of substrate, at a tapering angle of about 30°±3° as shown in FIG. 9E as against the desired ultimate tapering angle of 30°. Further, the line width of the pattern was 10±0.2 μm as against the predetermined line width of 10 μm, thus indicating a very excellent working of the thin film for forming a wiring.

Upon finishing the second etching, the etching chamber was evacuated until the ultimate vacuum thereof became 3 Pa or less (post-etching evacuation), after which the substrate 3 was taken out of the etching chamber 1. The time required for this post-etching evacuation was found to be 10 seconds when a booster-attached dry pump 12 having a sufficient evacuation capacity was employed.

As explained above, it was possible according to the etching method of this example to perform the etching taking only 324 seconds as against 760 seconds that has been required in the aforementioned conventional etching method, thus greatly shortening the etching time.

Since glass whose etching rate under the first etching condition can be disregarded as compared with the etching rate of the molybdenum tungsten alloy thin film 32 was employed as an underlying layer in this example, the etching of the underlying layer can hardly proceed during the second etching at the region where the underlying layer had been exposed by the first etching. This means that the activated radical useful for the etching reaction was not consumed for the underlying layer, so that any retardation in etching rate of the alloy thin film was not brought about in the region near the underlying layer. As a result, the change in etching rate in perpendicular direction of the alloy thin film was not brought about during the second etching step. This may be apparent also from FIG. 7.

In this invention, the point (timing) of detecting the etching end point was made earlier than that of Example 1. Namely, the thin film removal ratio at the moment of detecting the end point of the first etching according to this example was made smaller than that of Example 1 by 5%.

By doing so, it became possible to change the tapering angle of side wall of the pattern (i.e. the skirt portion of the cross-sectional shape thereof), which has been inclined at an angle of 40° as a result of the first etching, to an angle of 30±3°. Furthermore, since the thinning of pattern width during this etching can be minimized, it is possible to form a thin film wiring having a line width of 10±0.2 μm as against the predetermined line width of 10 μm throughout the entire surface of the substrate, thus indicating an excellent conversion precision of pattern.

EXAMPLE 3

This example illustrates an example wherein the method of this invention is applied to the manufacture of a thin film transistor to be employed for a liquid crystal display device.

Namely, a thin film transistor was manufactured on a glass substrate according to the process as shown in FIGS. 10A to 10H.

Figure 10A:
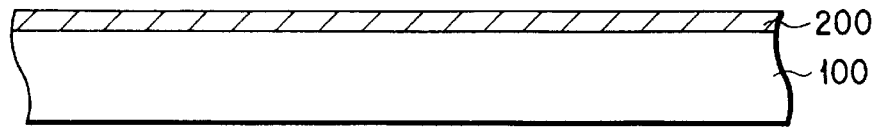
FIGS. 10A to 10H are cross-sectional views illustrating in stepwise a method of manufacturing a thin film transistor according to this invention.
Figure 10B:
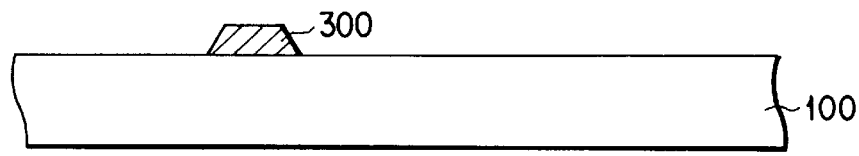
Figure 10C:
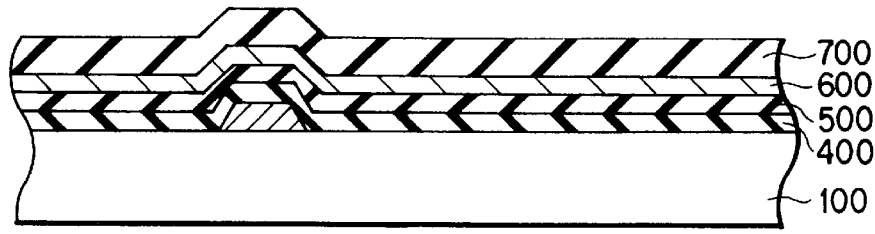

First of all, as shown in FIG. 10A, a MoW alloy film 200 having a thickness of 400 nm was formed on a main surface of the glass substrate 100 having a size of 550 mm×65 mm. Then, as shown in FIG. 10B, the MoW alloy film 200 was patterned to form a gate electrode 300 including a gate wiring. The patterning of the MoW alloy film 200 was performed as in the case of Example 2 by making use of the chemical dry etching apparatus shown in FIG. 4 and by following the flow chart shown in FIG. 8.

As a result, it was possible to perform the patterning taking only 320 seconds as against 760 seconds that has been required in the conventional etching method, thus greatly shortening the patterning time. Further, it was possible to form the gate electrode 300 having a line width of 10±0.2 μm as against the predetermined wiring line width of 10 μm throughout the entire surface of the substrate 100, thus indicating an excellent dimensional change. Furthermore, the tapering angle was controlled to 30±3° over the entire surface of the substrate as against the set angle of 30°.

Then, by means of CVD method, an $SiO_2$ film 400 as a gate insulating film having a thickness of 150 nm, an SiNx film 500 as a gate insulating film having a thickness of 150 nm, an amorphous silicon film 600 as a semiconductor film having a thickness of 50 nm and an SiNx film 7 having a thickness of 300 nm were successively formed on the surface of the substrate 100.

Figure 10D:
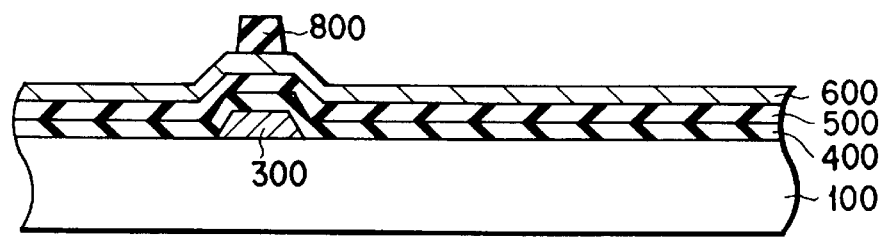
Figure 10E:
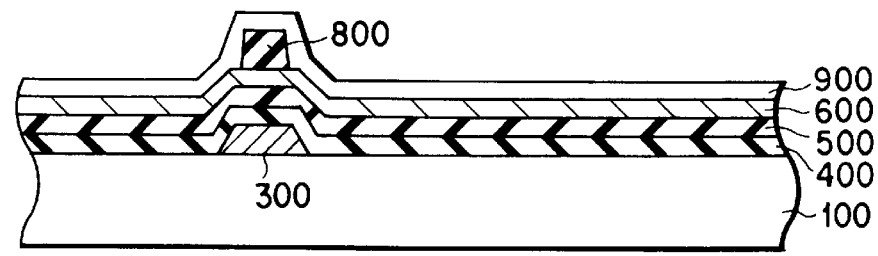
Figure 10F:
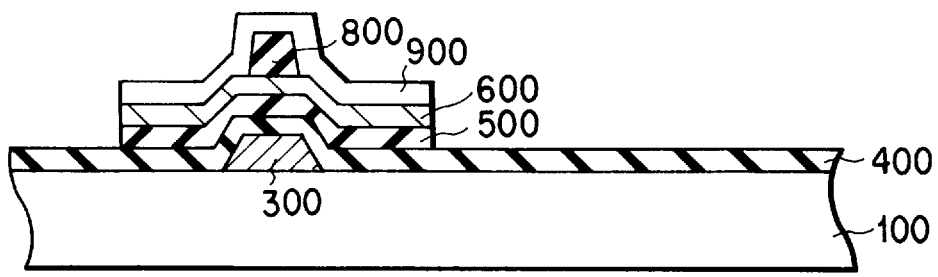

Thereafter, as shown in FIG. 10D, the SiNx film 700 was patterned thereby to form an etching stopper layer 800. Subsequently, as shown in FIG. 10E, a low resistance amorphous silicon film (n+amorphous Si film) 900 as an ohmic contact layer having a thickness of 50 nm was formed by CVD process all over the surface of the substrate. Then, as shown in FIG. 10F, the patternings of the low resistance amorphous silicon film 900, the amorphous silicon film 600 and the SiNx film 500 were successively performed.

Figure 10G:
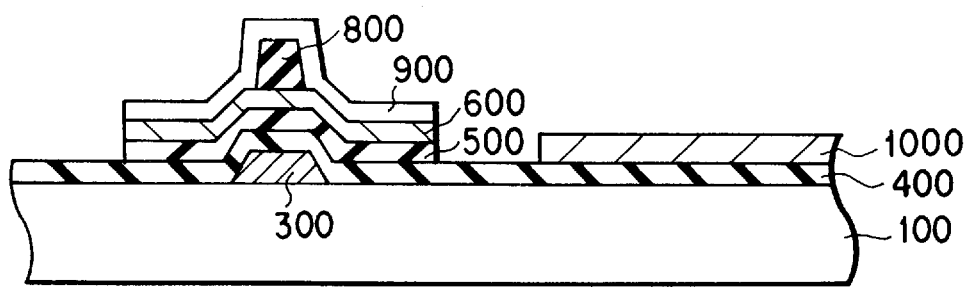
Figure 10H:
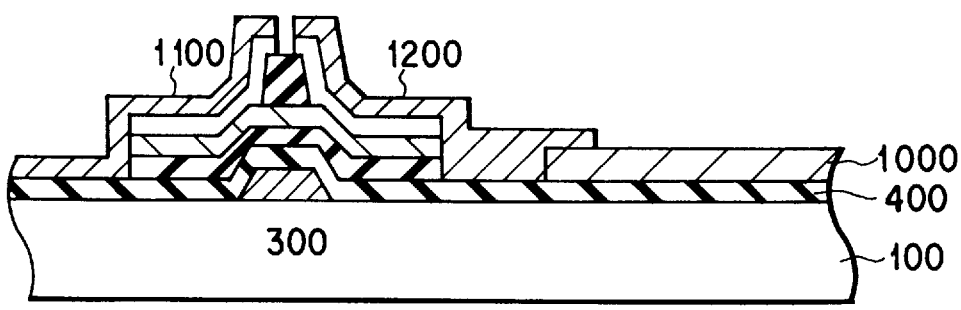

Then, after an ITO film was formed all over the surface of the substrate by means of sputtering, the ITO film was patterned to form a display pixel electrode 10 as shown in FIG. 10G. Further, an aluminum film was deposited all over the surface by means of sputtering and then patterned to form a signal line 1100 functioning also as a drain electrode, and a source electrode 1200 connected with the display pixel electrode 1000, thereby manufacturing a thin film transistor as shown in FIG. 10H.

As described above, since the gate wiring was formed using a two-step etching method according to this example in the manufacture of a thin film transistor on a glass substrate, the gate wiring could be formed in high precision and within a short period of time. Furthermore, since the gate electrode 300 was formed in a uniformly tapered manner, disconnection of the signal line 110 intersecting with the gate electrode 300 through the $SiO_2$ film 400 and SiNx film 500 and lowering of yield due to short-circuiting between the layers could suppressed. In particular, when the substrate is of large size and there are a region where the distance between wirings is coarse and a region where the distance between wirings is dense in the substrate as in the case of a liquid crystal TFT substrate, the detection of the end point of the first etching in a two-step etching method becomes difficult. However, according to the two-step etching method of this invention, since the end point of the first etching is set at the moment before the selective etching of the thin film to be treated is completed, i.e. at the moment when about 90% in area of an underlying layer disposed below the thin film is exposed, it is possible to accurately detect the end point of the first etching without being influenced by the loading effect.

In the above Examples 1 to 3, two kinds of etching condition was employed for changing to each other. However, it is also possible to employ three or more kinds of etching condition for changing to each other.

Further, in the above Examples, the mixing ratio of gases in addition to the pressure of gases, the electric power and the etching time were changed in the changing of the etching condition without changing the total gas flow rate. However, the changing of the etching condition can be performed by changing at least one or a combination of the factors selected from the total gas flow rate, the mixing ratio of gases, the pressure of gases, the electric power and the etching time.

Although the detection of the etching end point in the above examples was performed by measuring a change in pressure inside the etching chamber, it is also possible to perform the detection of the etching end point by measuring the luminous intensity of the etching chamber.

The method of etching in this example is not limited to the aforementioned chemical dry etching, but may be another kind of method such as a plasma etching method.

According to this example, the moment where a superfluous portion of the thin film has been removed in 90% of the entire area thereof was defined as the end point of the first etching, it is possible to change the setting of end point of the first etching as long as the ratio of removal of a superfluous portion of the thin film is within the range of 80 to 100% of the entire area thereof.

In short, the above examples are featured in that the etching away of any superfluous portion of the thin film is carried out at a high speed in the first etching step so as to form an incompletely etched sectional shape where the lower portion thereof is gradually expanded toward the bottom thereof, and that the etching in the second etching step is performed with an etching rate gradient which is uniform in perpendicular direction of the thin film. Due to the employment of these first and second etching steps, the dimensional precision, the etching residue of thin film and the tapering angle of pattern can be suitably controlled.

As explained above, according to the dry etching method of this invention, the first etching step is aimed at rapidly removing a region of thin film which is redundant for the formation of a pattern, while the second etching step is aimed at removing a redundant residual portion of thin film, at aligning the pattern with a predetermined patterning dimension and at aligning the side wall of the pattern with a predetermined tapering angle. Therefore, it has become possible to perform an excellent etching within a short period of time.

Since the purposes of etching are shared by these etching steps, the alignment of etching conditions becomes easy, thus obviating any requirement to select a suitable etching condition by observing the configuration of pattern finally obtained and by making use of a cut-and-try method.

Furthermore, the changing of etching conditions is performed by detecting the end point of etching by means of an etching end point-detection mechanism at the moment before the selective etching of the thin film to be treated is accomplished, i.e. at the moment when the underlying layer disposed below the thin film begins to be exposed and the etching rate is caused to prominently alter. Since the changing of etching conditions is performed in this manner, the problems that may be raised when the etching is performed under the same condition throughout the entire etching process may be obviated. In other words, it is no more required to take the influences of a change in etching condition due to the exposure of the underlying layer into consideration in the selection of the etching condition. Further, even if the thickness of the thin film or the distribution of thickness thereof is altered, it is possible to form an excellent etched pattern in high reproducibility, since the etching time of the first etching step is controlled by making use of an etching end point-detection mechanism while the etching time of the second etching step is set to 20 to 40% of that of the first etching step.

In particular, if a wiring pattern of thin film consisting of a high melting point metal is to be formed, it is desirable to employ, as an underlying layer, a silicon oxide thin film whose etching rate is in the range of 1 to 10% in relative to the etching rate of the high melting point metal under the condition of the first etching step. Because, since a reaction takes place between the activated free radical and the underlying layer at the region very close to the underlying layer during the etching under the second etching condition, the etching of the metallic thin film at this region becomes very slow, so that the etching rate is caused to vary in perpendicular direction from the surface of underlying layer to the top of the metallic thin film, i.e. the etching rate of the metallic thin film is very slow in the vicinity of the underlying layer but becomes faster as it is located further away from the underlying layer. As a result of this phenomenon, the side wall of the metallic thin film is caused to taper thereby making it possible within a short period of etching time to obtain a wiring excellent in working precision and in tapering angle.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dry etching method of a thin film comprising the steps of:

forming a resist patter on a thin film;

performing a first etching wherein said thin film is selectively dry-etched under a first etching condition using said resist pattern as a mask; and performing a second etching wherein said thin film is selectively dry-etched under a second etching condition using said resist pattern as a mask, said second etching condition differing from said first etching condition;

wherein changing from said first etching step to said second etching step is preformed after a part of an underlying layer, which does not correspond to the resist mark, disposed below said thin film is exposed and before the selective etching of said thin film is accomplished.

2. The dry etching method of a thin film according to claim 1, wherein said changing is preformed when at least 80% in area of said underlying layer, which does not corresponds to the resist mask, disposed below said thin film is exposed.

3. The dry etching method of a thin film according to claim 1, wherein said first etching condition differs from said second etching condition with respect to at least one of factors selected from a total gas flow rate, a mixing ratio of gases, a gas pressure, an electric power to be applied, and an etching period.

4. The dry etching method of a thin film according to claim 1, wherein said first etching condition is same with said second etching condition with respect to the kind of gases to be employed for the etching.

5. The dry etching method of a thin film according to claim 1, wherein the changing of said first etching condition to said second etching condition is performed by detecting an end point of said first etching step.

6. The dry etching method of a thin film according to claim 1, wherein a ratio in etching rate between said resist pattern and said thin film in said first etching condition is in the range of 1/0.8 to 1/1.2, and a ratio in etching rate between said resist pattern and said thin film in said second etching condition is in the range of 1/0.15 to 1/0.25.

7. The dry etching method of a thin film according to claim 6, wherein the etching rate of said thin film in said first condition is in the range of 10 to 300 nm/min, and the etching rate of said thin film in said second condition is in the range of 25 to 40% of the etching rate thereof in said first etching condition.

8. The dry etching method of a thin film according to claim 7, wherein the etching time in said second etching condition is 20 to 40% of the etching time in said first etching condition.

9. The dry etching method of a thin film according to claim 6, wherein the pressure in said second etching condition is higher than the pressure in said first etching condition by 10 Pa or more.

10. The dry etching method of a thin film according to claim 1, wherein the etching rate of an underlying layer disposed below said thin film in said second condition is 1 to 8% based on the etching rate of said thin film.

11. The dry etching method of a thin film according to claim 5, wherein an end point of said first etching step is detected by measuring a change in pressure of etching atmosphere.

12. The dry etching method of a thin film according to claim 5, wherein an end point of said first etching step is detected by measuring a change in luminous intensity around said thin film.

13. The dry etching method of a thin film according to claim 5, wherein an end point of said first etching step is detected by making use of an added value of two or more kinds of values detected.

14. A method of manufacturing a thin film semiconductor device comprising the steps of:

forming a conductive film on a transparent substrate;

forming a resist pattern on said conductive film;

performing a first etching wherein said conductive film is selectively dry-etched under a first etching condition with said resist pattern being employed as a mask; and performing a second etching wherein said conductive film is selectively dry-etched under a second etching condition with said resist pattern being employed as a mask thereby to form a gate electrode, said second etching condition differing from said first etching condition;

wherein changing from said first etching step to said second etching step is performed after a part of an underlying layer, which does not correspond to the resist mark, disposed below said thin film is exposed and before the selective etching of said conductive film is accomplished.

15. The method of manufacturing a thin film semiconductor device according to claim 14, wherein said before the selective etching of said conductive film is accomplished is a moment when at least 80% in area of said underlying layer disposed below said conductive film is exposed.

16. The method of manufacturing a thin film semiconductor device according to claim 14, wherein said first etching condition differs from said second etching condition with respect to at least one of factors selected from a total gas flow rate, a mixing ratio of gases, a gas pressure, an electric power to be applied, and an etching period.

17. The method of manufacturing a thin film semiconductor device according to claim 14, wherein said first etching condition is the same with said second etching condition with respect to the kind of gases to be employed for the etching.

18. The method of manufacturing a thin film semiconductor device according to claim 14, wherein the changing of said first etching condition to said second etching condition is performed by detecting an end point of said first etching step.

19. The method of manufacturing a thin film semiconductor device according to claim 14, wherein a ratio in etching rate between said resist pattern and said conductive film in said first etching condition is in the range of 1/0.8 to 1/1.2, and a ratio in etching rate between said resist pattern and said conductive film in said second etching condition is in the range of 1/0.15 to 1/0.25.

* * * * *